US011122675B2

United States Patent
Park et al.

(10) Patent No.: US 11,122,675 B2
(45) Date of Patent: Sep. 14, 2021

(54) PRINTED CIRCUIT BOARD INCLUDING OVERVOLTAGE CONTROLLING ELEMENT AND ELECTRONIC DEVICE INCLUDING THE SAME

(71) Applicant: SAMSUNG ELECTRONICS CO., LTD., Suwon-si (KR)

(72) Inventors: Hyunjun Park, Suwon-si (KR); Hongkook Lee, Suwon-si (KR); Dongkyoon Han, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/008,348

(22) Filed: Aug. 31, 2020

(65) Prior Publication Data

US 2020/0396827 A1 Dec. 17, 2020

Related U.S. Application Data

(63) Continuation of application No. 16/536,565, filed on Aug. 9, 2019, now Pat. No. 10,764,991.

(30) Foreign Application Priority Data

Aug. 9, 2018 (KR) ........................ 10-2018-0093378

(51) Int. Cl.
*H05K 1/02* (2006.01)
*H05K 1/18* (2006.01)
(Continued)

(52) U.S. Cl.
CPC ......... *H05K 1/0213* (2013.01); *G09G 3/3208* (2013.01); *H05K 1/0277* (2013.01);
(Continued)

(58) Field of Classification Search
CPC .... H05K 1/0213; H05K 1/0277; H05K 1/155; H05K 1/181; H05K 2201/10015;
(Continued)

(56) References Cited

U.S. PATENT DOCUMENTS 8,072,774 B2 12/2011 Tokoro
9,761,578 B2 9/2017 Yoon et al.
(Continued)

FOREIGN PATENT DOCUMENTS

JP          4978269        7/2012
KR   10-2013-0116981     10/2013
(Continued)

OTHER PUBLICATIONS

International Search Report and Written Opinion dated Nov. 29, 2019 in counterpart International Patent Application No. PCT/KR2019/010111.
(Continued)

*Primary Examiner* — Michael Pervan
(74) *Attorney, Agent, or Firm* — Nixon & Vanderhye, P.C.

(57) ABSTRACT

Disclosed is a printed circuit board including an overvoltage controlling element and an electronic device including the same. The printed circuit board includes a first outer layer, a second outer layer, at least one inner layer stacked between the first and second outer layers, an overvoltage controlling element comprising overvoltage controlling circuitry mounted on the first outer layer and including a plurality of terminals of which a first terminal is connected to a ground, and a conductive area configured to transfer at least a part of a first voltage applied from an external power source to an external IC and to transfer a remaining part of the first voltage to the overvoltage controlling element.

8 Claims, 13 Drawing Sheets

(51) Int. Cl.
*H05K 1/11* (2006.01)
*G09G 3/3208* (2016.01)

(52) U.S. Cl.
CPC .............. *H05K 1/115* (2013.01); *H05K 1/181* (2013.01); *G09G 2300/0408* (2013.01); *G09G 2330/04* (2013.01); *H05K 2201/10015* (2013.01); *H05K 2201/10128* (2013.01); *H05K 2201/10174* (2013.01)

(58) Field of Classification Search
CPC .......... H05K 2201/10128; H05K 2201/10174; G09G 3/3208; G09G 2300/0408; G09G 2330/04
See application file for complete search history.

(56) References Cited

U.S. PATENT DOCUMENTS

| | | |
|---|---|---|
| 10,256,226 B2 | 4/2019 | Yoon et al. |
| 10,666,247 B2 | 5/2020 | Kim |
| 2003/0076640 A1 | 4/2003 | Malherbe et al. |
| 2004/0042141 A1 | 3/2004 | Mikolajczak et al. |
| 2004/0109275 A1 | 6/2004 | Whitney |
| 2006/0152334 A1 | 7/2006 | Maercklein et al. |
| 2008/0100981 A1 | 5/2008 | Chen et al. |
| 2008/0238585 A1 | 10/2008 | Tokoro |
| 2011/0211289 A1 | 9/2011 | Kosowsky et al. |
| 2014/0168052 A1 | 6/2014 | Zhang |
| 2014/0184959 A1 | 7/2014 | Zhang et al. |
| 2015/0115271 A1 | 4/2015 | Yoon et al. |
| 2017/0039984 A1 | 2/2017 | Joo et al. |
| 2017/0244163 A1 | 8/2017 | Yoo et al. |
| 2017/0290158 A1 | 10/2017 | Pihlman et al. |
| 2017/0338220 A1 | 11/2017 | Yoon et al. |
| 2018/0018294 A1 | 1/2018 | Park et al. |
| 2018/0097516 A1 | 4/2018 | Kim |

FOREIGN PATENT DOCUMENTS

| | | |
|---|---|---|
| KR | 10-2017-0098107 | 8/2017 |
| KR | 10-2018-0009083 | 1/2018 |

OTHER PUBLICATIONS

Park et al, U.S. Appl. No. 16/536,565, filed Aug. 9, 2019.
Extended Search Report dated Jul. 9, 2021 in European Application No. 19846117.0.

PRINTED CIRCUIT BOARD INCLUDING OVERVOLTAGE CONTROLLING ELEMENT AND ELECTRONIC DEVICE INCLUDING THE SAME

CROSS-REFERENCE TO RELATED APPLICATION

This application is a continuation of U.S. application Ser. No. 16/536,565, filed on Aug. 9, 2018, which claims priority to Korean Patent Application No. 10-2018-0093378, filed Aug. 9, 2018. The contents of each of these applications are incorporated herein in their entirety.

BACKGROUND

1. Field

The disclosure relates to a printed circuit board including an overvoltage controlling element and an electronic device including the same.

2. Description of Related Art

As information technology (IT) has been developed, various types of electronic devices such as a smart phone, a tablet personal computer (PC), and the like have been widely used. The electronic device may include a plurality of integrated circuits (ICs) for performing various functions. For example, the electronic device may include a display driver integrated circuit for controlling the operation of the display. As another example, an electronic device may include a power management integrated circuit (PMIC) for converting and delivering power generated from a battery to a power source of a desired magnitude in each integrated circuit.

The integrated circuits may be electrically connected to each other and the electrical connection may be made through a printed circuit board (or a flexible printed circuit board). For example, the power management integrated circuit and the display driver integrated circuit may be electrically connected to each other through a printed circuit board, for example, a conductive area mounted on a printed circuit board. Thus, the display driver integrated circuit may receive the power required for operation from the power management integrated circuit and output a specified image onto a display.

The amounts of power required for each integrated circuit may be different, and the maximum rated power may be determined at an input terminal of each integrated circuit. When a power exceeding the maximum rated power is applied to the input terminal of the integrated circuit, the integrated circuit may be damaged so that abnormal operation may occur. For example, when a power exceeding the maximum rated power is applied to a display driver integrated circuit, the display driver integrated circuit may be damaged due to the excessive power supply, and an abnormal screen may be output onto a display.

A power exceeding a specified intensity of power may be output from a power applying side, for example, a battery or a power management integrated circuit for various reasons. In this case, the excessive power may be applied to the integrated circuit having the specified maximum rated power and cause abnormal operation. To prevent this, an overvoltage preventing element may be arranged on a printed circuit board to which the power is supplied. The overvoltage preventing element absorbs a part of the applied power such that the power exceeding the maximum rated power may be prevented from being inputted to the integrated circuit.

However, when the overvoltage preventing element is simply connected to a power supply path, there is a limit to the prevention of an overvoltage. For example, when a voltage exceeding a specified level is applied, a power exceeding the maximum rated power may be applied to the integrated circuit even though the overvoltage preventing element is connected. Therefore, there is a need to optimally configure a circuit including an overvoltage preventing element to effectively prevent an overvoltage.

The above information is presented as background information only to assist with an understanding of the disclosure. No determination has been made, and no assertion is made, as to whether any of the above might be applicable as prior art with regard to the disclosure.

SUMMARY

Embodiments of the disclosure address at least the above-mentioned problems and/or disadvantages and to provide at least the advantages described below. Accordingly, an aspect of the disclosure is to provide an electronic device.

In accordance with an example aspect of the disclosure, a printed circuit board includes a first outer layer, a second outer layer, at least one inner layer stacked between the first and second outer layers, an overvoltage controlling (e.g., preventing and/or reducing) element comprising overvoltage controlling circuitry mounted on the first outer layer and including a plurality of terminals of which a first terminal is connected to a ground, and a conductive area configured to transfer at least a part of a first voltage applied from an external power source to an external IC and to transfer a remaining part of the first voltage to the overvoltage controlling element, wherein the conductive area includes a first portion arranged on the at least one inner layer and electrically connected to the external power source, a second portion having at least a portion arranged on the first outer layer, the second portion electrically connecting a second terminal of the overvoltage controlling element to the external IC, and a conductive via formed between the external power source and the overvoltage controlling element to electrically connect the first portion and the second portion.

In accordance with another example aspect of the disclosure, an electronic device includes a housing, a display panel arranged inside the housing, a display driver integrated circuit electrically connected to the display panel and configured to control an operation of the display panel, a power regulator, and a printed circuit board coupled to a part of the display panel to electrically connect the power regulator and the display driver integrated circuit, wherein the printed circuit board includes a first outer layer on which an overvoltage controlling element comprising overvoltage controlling circuitry is mounted, a second outer layer, at least one inner layer stacked between the first and second outer layers, and a conductive area, wherein the overvoltage controlling element includes a plurality of terminals of which a first terminal is electrically connected to a ground, wherein the conductive area includes a first portion arranged on the at least one inner layer and electrically connected to the power regulator, a second portion having at least a portion arranged on the first outer layer, the second portion being electrically connected to a second terminal of the overvoltage controlling element and the display driver integrated circuit, and a conductive via formed between the power regulator and the overvoltage controlling element to electrically connect the first portion and the second portion, and wherein the power regulator is configured to: apply a first voltage to one end of the conductive area, transfer at least a part of the first voltage to the display driver integrated circuit, and transfer a remaining part to the overvoltage controlling element.

Other aspects, advantages, and salient features of the disclosure will become apparent to those skilled in the art from the following detailed description, which, taken in conjunction with the annexed drawings, discloses various example embodiments of the disclosure.

BRIEF DESCRIPTION OF THE DRAWINGS

The above and other aspects, features, and advantages of certain embodiments of the disclosure will be more apparent from the following detailed description taken in conjunction with the accompanying drawings, in which.

In connection with the description of the drawings, the same or similar reference numerals may be used for the same or similar components.

DETAILED DESCRIPTION

Figure 1:
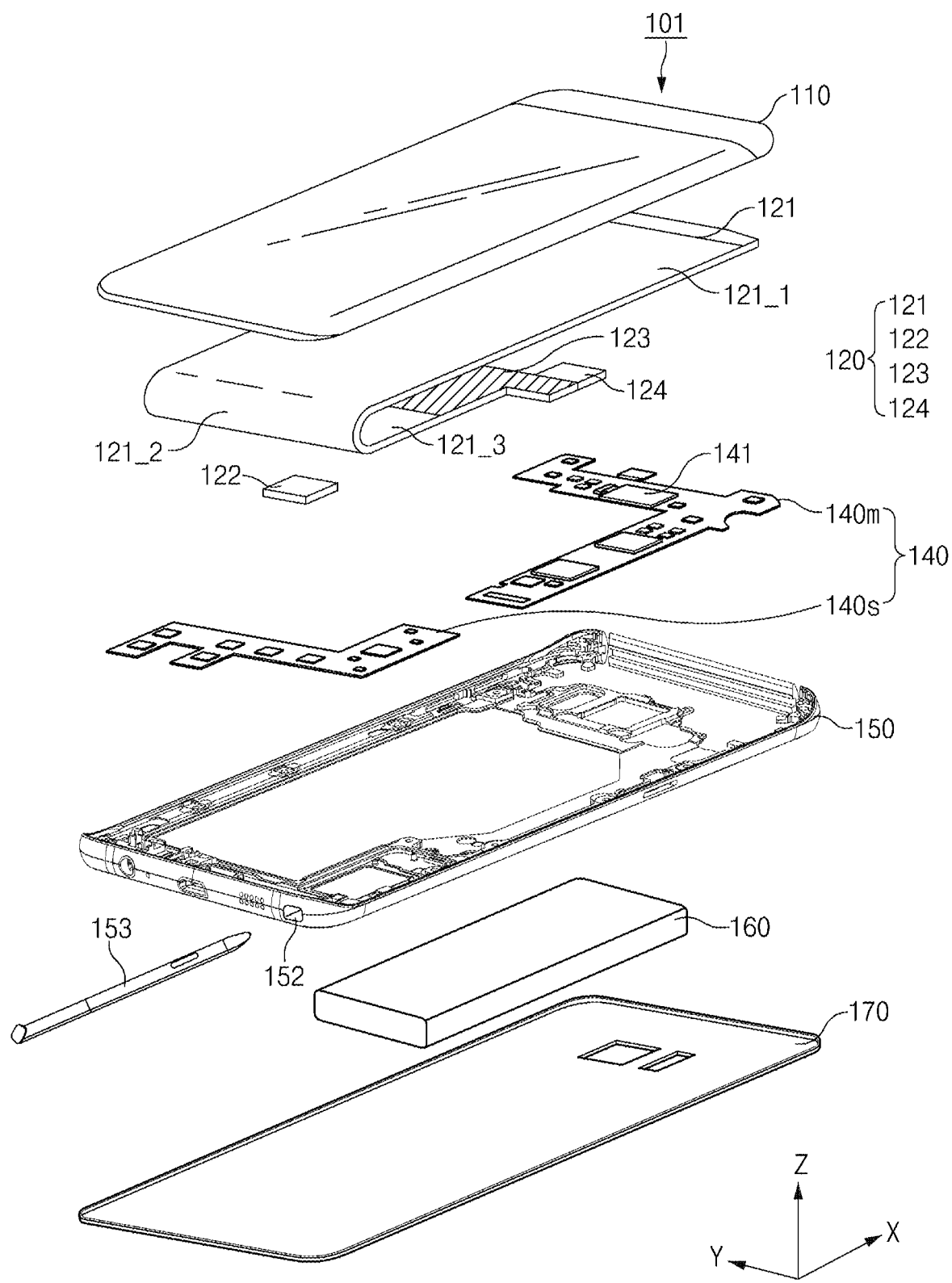
FIG. 1 is an exploded perspective view illustrating an example electronic device according to an embodiment.

FIG. 1 is an exploded perspective view illustrating an example electronic device according to an embodiment.

Referring to FIG. 1, an electronic device 101 according to an embodiment may include a cover glass 110, a display 120, a circuit board 140, a side member (e.g., a side housing, side surface, side wall, or the like) 150, a battery 160, and/or a back cover 170. According to various embodiments, the electronic device 101 may not include some of configurations shown in FIG. 1 and may further include configurations which are not shown in FIG. 1.

According to an embodiment, the cover glass 110, the side member 150, and the back cover 170 may be coupled to each other to form a housing of the electronic device 101. In various embodiments, the housing may include a first surface corresponding to the cover glass 110, a second surface corresponding to the back cover 170, and a side surface surrounding the space between the first and second surfaces. According to an embodiment, the cover glass 110 and the side member 150 may be formed in a single configuration. According to another embodiment, the back cover 170 and the side member 150 may be formed in a single configuration.

According to an embodiment, the cover glass 110 may transmit light generated by the display 120 to an outside of the electronic device 101. According to another embodiment, the cover glass 110 may transmit light outside the electronic device 101 or light generated by the electronic device 101 and reflected by an external object into an inside of the electronic device 101. For example, the cover glass 110 may transmit light reflected by a body part of a user to recognize the pattern of the fingerprint or iris of the user.

According to an embodiment, the display 120 may be arranged in the space between the cover glass 110 and the back cover 170. For example, the display 120 may be arranged below or coupled to the cover glass 110 and exposed through at least a portion of the cover glass 110. The display 120 may output contents (e.g., text, images, video, icons, widgets, symbols, or the like) or may receive an input from the user (e.g., a touch input or an electronic pen input).

According to an embodiment, the display 120 may include a display panel 121, a board 123, a connector 124, and a display driver integrated circuit 122. According to various embodiments, the display 120 may further include some configuration as well as the above components.

According to an embodiment, the display panel 121 may include, for example, and without limitation, a liquid crystal display (LCD) panel, a light emitting diode (LED) display panel, an organic light emitting diode (OLED) display panel, a micro-electro mechanical system (MEMS) display panel, an electronic paper display panel, or the like.

According to an embodiment, the display panel 121 may include a first planar area 121_1 and a bent area 121_2 extending from one side (e.g., an upper side, a lower side, a left side, or a right side) of the first planar area 121_1. According to an embodiment, a part of the bent area 121_2 may be folded toward a back surface of the planar area 121_1.

According to an embodiment, pixels (e.g., OLEDs) of the display panel 121, a touch sensor, an electronic pen sensor, and/or a conductive pattern of them may be arranged in the first planar area 121_1. According to an embodiment, various conductive patterns (lines), which may electrically connect the board 123 placed on the back surface of the display panel 121 to various electric elements arranged in the first planar area 121_1, may be arranged in the bent area 121_2.

According to an embodiment, the display panel 121 may further include a second planar area 121_3 which is distinguished from the first planar area 121_1 and extends from the bent area 121_2 toward one side. According to an embodiment, the second planar area 121_3 may be connected to the board 123.

According to various embodiments, the board 123 may, for example, and without limitation, be a rigid printed circuit board (RPCB), a flexible printed circuit board (FPCB), a high density interconnection board, a substrate like PCB (SLP), or the like.

According to an embodiment, the board 123 may include an over-voltage controlling (e.g., preventing and/or reducing) circuit (not shown). In an embodiment, the overvoltage controlling circuit may absorb a specified amount of power such that power, which exceeds a specified range of rated power (e.g., power intensity of the maximum rated power or the maximum allowable range of power), is controlled to avoid an overvoltage from being applied to an integrated circuit, for example, the display driver integrated circuit 122, which is supplied with power from a power regulator 141.

According to an embodiment, the connector 124 may be attached to one end of the board 123. The connector 124 may interconnect conductive lines arranged on the board 123 and the circuit board 140. According to various embodiments, an electrical element (e.g., the power regulator 141) arranged on the circuit board 140 may be electrically connected to the board 123 by the connector 124.

According to an embodiment, the display driver integrated circuit 122 may be electrically connected to the display panel 121 and may control the on or off of pixels included in the display panel 121. In an embodiment, the display driver integrated circuit 122 may control the brightness of the pixels by changing the intensity of a grayscale voltage supplied to the display panel 121. In another embodiment, the display driver integrated circuit 122 may receive image data from a processor (host) and supply the signal corresponding to the image data to the display panel 121 in the set number of frames.

According to an embodiment, the display driver integrated circuit 122 may be arranged in a specified area of the display panel 121. For example, the display driver integrated circuit 122 may be arranged in a specified area between the bent area 121_2 of the display panel 121 and the board 123. As still another example, the display driver integrated circuit 122 may be arranged in a specified area of the second planar area 121_3 of the display panel 121. According to various embodiments, a scheme of attaching the display driver integrated circuit may include, for example, and without limitation, one of a chip on plastic (COP), a chip on film (COF), a chip on glass (COG), or the like.

According to an embodiment, the circuit board 140 may include, for example, a main circuit board 140m, or a sub-circuit board 140s. According to an embodiment, the main circuit board 140m and the sub-circuit board 140s may be arranged between the board 123 and the back cover 170. The main circuit board 140m and the sub-circuit board 140s may be electrically connected to each other through a specified connector or a specified line. For example, the circuit boards 140m and 140s may be implemented with a rigid printed circuit board or a flexible printed circuit board.

According to an embodiment, various kinds of electronic components and printed circuits of the electronic device 101 such as the power regulator 141, a wireless communication circuit (not shown), or a processor (not shown) may be mounted or arranged on the circuit boards 140m and 140s.

According to an embodiment, the power regulator 141 may supply power to an integrated circuit or an electrical device included in the electronic device 101. For example, the power regulator 141 may supply power to the display driver integrated circuit 122 such that the display driver integrated circuit 122 generates the grayscale voltage. The power regulator 141 may be electrically connected to the display driver integrated circuit 122 through the board 123.

According to an embodiment, the side member 150 may be arranged between the circuit board 140 and the back cover 170 to house the components of the electronic device 101. According to various embodiments, an elongated hole 152 extending inwardly of the side member 150 may be formed at a portion of the side member 150. For example, the hole may contain an electronic pen (stylus pen) 153.

According to an embodiment, the battery 160 may inter-convert chemical and electrical energy. For example, the battery 160 may convert chemical energy into electrical energy and supply the electrical energy to various components or modules mounted on the display 120 and the circuit board 140.

According to an embodiment, the back cover 170 may be coupled to the back surface of the electronic device 101. The back cover 170 may be formed, for example, and without limitation, of tempered glass, plastic injection molding, metal, and the like.

Figure 2:
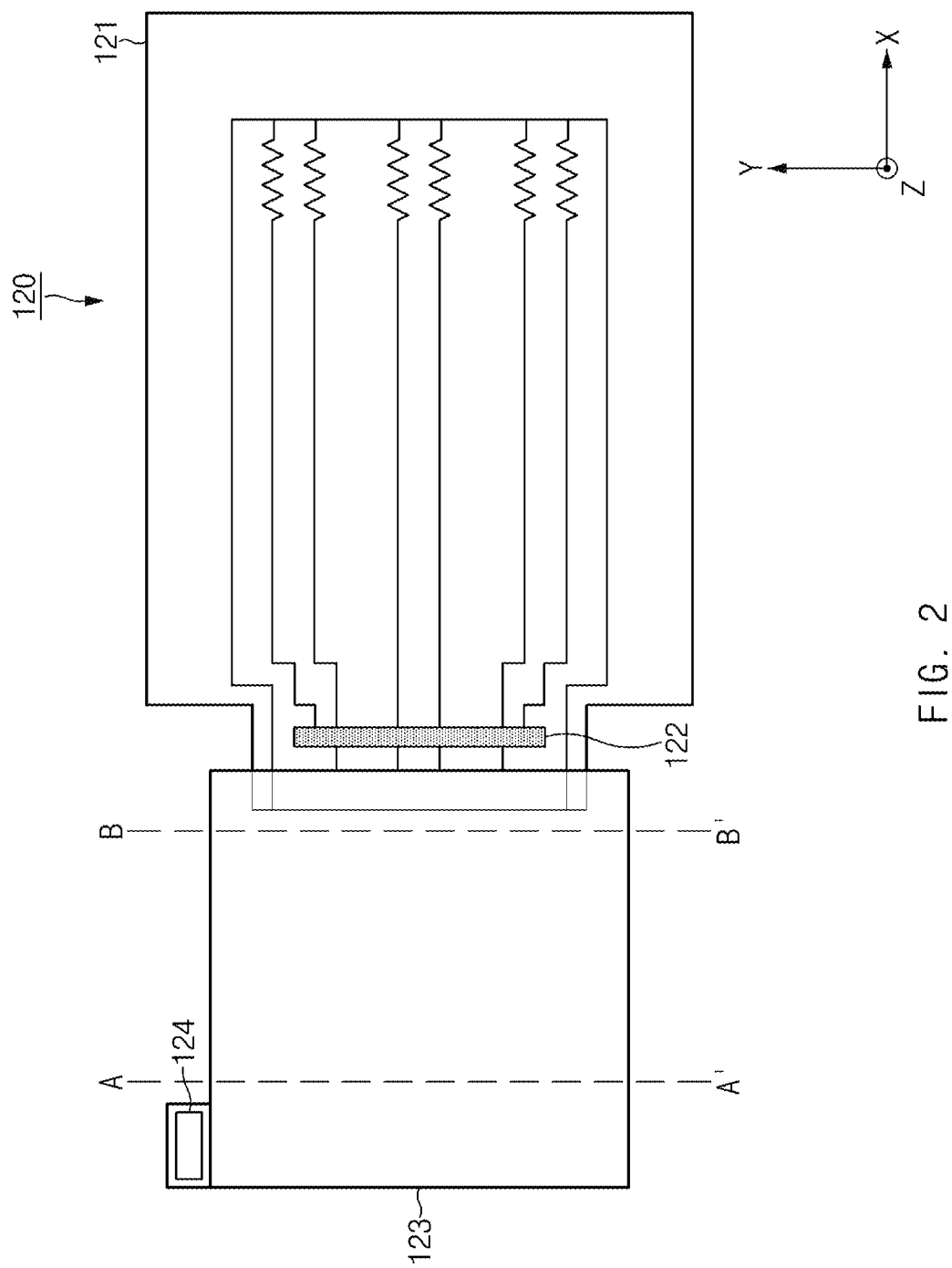
FIG. 2 is a plan view of an example display according to an embodiment.

FIG. 2 is a plan view of an example display according to an embodiment.

Referring to FIG. 2, the display 120 may include the display panel 121, the board 123, the connector 124, and the display driver integrated circuit 122.

According to an embodiment, the display panel 121 may include a planar area (e.g., the first planar area 121_1 of FIG. 1) and the bent area (e.g., the bent area 121_2 of FIG. 1). The display panel 121 shown in FIG. 2 may be understood as a state in which the bent area is unfolded. A plurality of pixels may be arranged in the planar area, and each of the pixels may be electrically connected to the display driver integrated circuit 122 through a plurality of leads.

According to an embodiment, the board 123 may be connected to the display panel 121. According to various embodiments, the board 123 may be of various forms. For example, the board 123 may be of a substantially rectangular shape when viewed from above. As another example, the board 123 may be of a rectangular shape of which the inside is partially recessed when viewed from above in order to secure a space in which the battery 160 of the electronic device 101 is arranged. In other words, the width of the area corresponding to the single line A-A' of the board 123 shown in FIG. 2 may be smaller than that of the area corresponding to a single line B-B'.

According to an embodiment, at least one of the plurality of layers included in the board 123, for example, an inner layer, may extend toward the display panel 121. In an embodiment, the board 123 and the display panel 121 may be connected by the extended at least one layer.

According to an embodiment, a plurality of conductive lines arranged on the board 123 may be connected to the display driver integrated circuit 122. According to one embodiment, the plurality of conductive lines may be arranged on the surface of the display panel 121 in a curved area of the display panel 121 (e.g., the bent area 121_2 in FIG. 1). According to an embodiment, the display panel 121 may include a flexible substrate, and the plurality of conductive lines may be arranged on the flexible substrate.

According to an embodiment, the connector 124 may be attached to one side of the board 123. The connector 124 may be connected to a circuit board (e.g., the circuit board 140 of FIG. 1), and may electrically connect the circuit board 140 and the board 123.

Figure 3A:
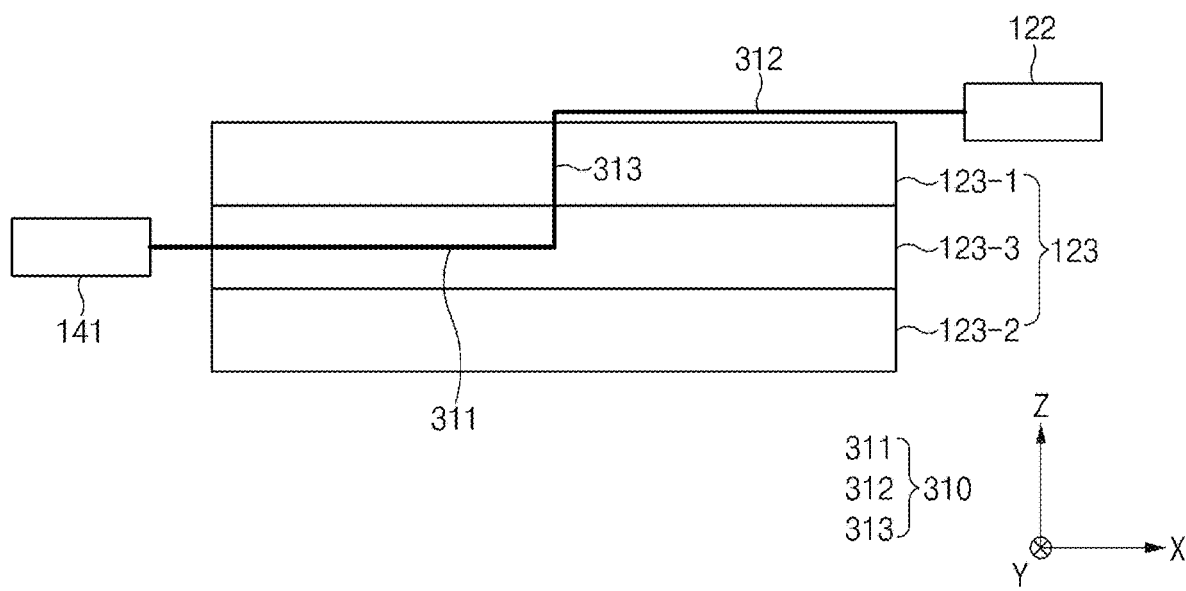
FIG. 3A is a side view illustrating an example printed circuit board on which an overvoltage controlling element is mounted, according to an embodiment.
Figure 3B:
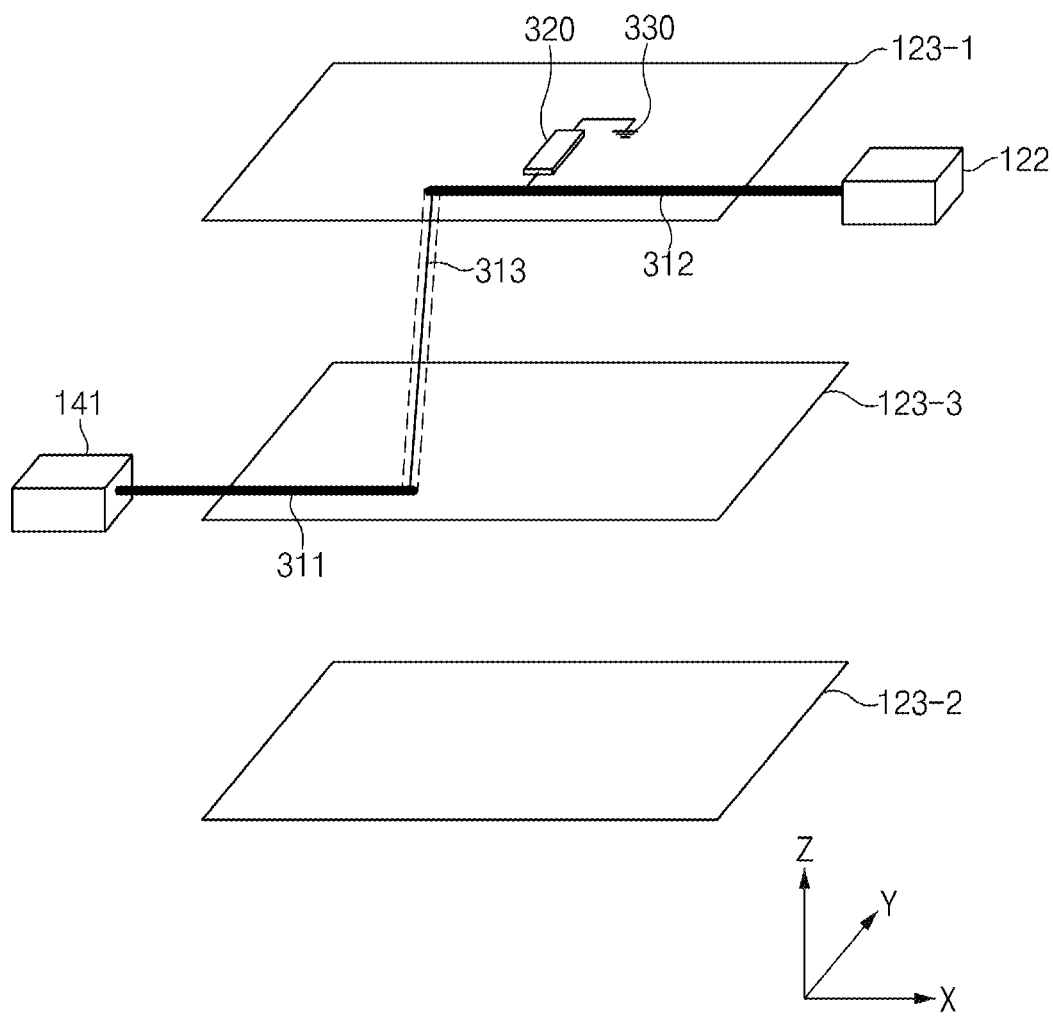
FIG. 3B is an exploded perspective view of an example printed circuit board on which an overvoltage controlling element is mounted, according to an embodiment.

FIG. 3A is a side view of an example printed circuit board on which an overvoltage controlling element is mounted, according to an embodiment. FIG. 3B is an exploded perspective view of an example printed circuit board on which an overvoltage controlling element is mounted, according to an embodiment.

Referring to FIG. 3A, the printed circuit board 123 (e.g., the board 123 of FIG. 1) can transmit the power applied from the power regulator 141 to the display driver integrated circuit 122. According to various embodiments, the display driver integrated circuit 122 may be an example embodiment of an external IC to which the power regulator 141 supplies power through the printed circuit board 123. For example, the display driver integrated circuit 122 of FIG. 3A may be replaced with another external IC.

According to an embodiment, the printed circuit board 123 may include a plurality of layers. For example, the printed circuit board 123 may include a first outer layer 123-1, a second outer layer 123-2, and at least one inner layer 123-3. According to various embodiments, the at least one inner layer 123-3 is shown in FIG. 3A as a single layer, but may include more than one layer unlike that shown in FIG. 3A. According to one embodiment, the at least one inner layer 123-3 may be thinner than the first outer layer 123-1 or the second outer layer 123-2. In one embodiment, the at least one inner layer 123-3 may have a width wider than that of the first or second outer layer 123-1 or 123-2 to compensate for the high impedance due to the relatively thin thickness.

According to an embodiment, the printed circuit board 123 may include a conductive area 310. According to an embodiment, the conductive area 310 may be arranged on at least one layer of the printed circuit board 123. For example, a first portion 311 of the conductive area 310 may be electrically connected to the power regulator 141 and arranged in the at least one inner layer 123-3. As another example, a second portion 312 of the conductive area 310 may be electrically connected to the display driver integrated circuit 122 and arranged in the first outer layer 123-1. As another example, the conductive area 310 may include a conductive via 313 that electrically connects the first and second portions 311 and 312. In the disclosure, the conductive via 313 may be referred to as the first conductive via 313.

According to an embodiment, the printed circuit board 123 may electrically connect the power regulator 141 and the display driver integrated circuit 122 through the conductive area 310. In various embodiments, it may be understood that the conductive area 310 includes at least one conductive line. The printed circuit board 123 may transmit at least a part of the power applied from the power regulator 141 to the display driver integrated circuit 122 through the conductive area 310. At least a part of the power may be smaller than the rated power (e.g., the maximum rated power) in a specified range of the display driver integrated circuit 122.

According to various embodiments, the printed circuit board 123 is not limited to that shown in FIG. 3A. For example, the printed circuit board 123 may electrically connect the power regulator 141 and at least one integrated circuit through the conductive area 310. In the disclosure, the description described in FIG. 3A may be equally applied to components having the same reference numeral as that of the printed circuit board 123 shown in FIG. 3A.

Referring to FIG. 3B, an overvoltage controlling element (e.g., including overvoltage controlling circuitry) 320 may be mounted on the first outer layer 123-1. According to an embodiment, the overvoltage controlling element 320 may be electrically connected to a ground 330 and the second portion 312 of the conductive area 310. For example, the overvoltage controlling element 320 may have a plurality of terminals of which a first terminal is electrically connected to the ground 330 and a second terminal is electrically connected to the second portion 312 of the conductive area.

According to an embodiment, the overvoltage controlling element 320 may include various overvoltage controlling circuitry, such as, for example, and without limitation, a diode such as a transient voltage suppression (TVS) diode, a decoupling capacitor, or the like. In various embodiments, the overvoltage controlling element 320 may be turned off when a voltage, which is less than a specified magnitude, is applied to the second terminal of the overvoltage controlling element 320, and be turned on when a voltage, which is equal to or greater than the specified magnitude, is applied to the second terminal. Accordingly, a part of the power applied from the power regulator 141 may be absorbed in the overvoltage controlling element 320 and the display driver integrated circuit 122 may be supplied with a power which is less than the rated power (e.g., the maximum rated power or the intensity of the maximum allowable power) in the specified range. In other words, the second portion 312 may electrically connect the overvoltage controlling element 320 and the display driver integrated circuit 122, and the power supplied from the power regulator 141 is divided and supplied to the overvoltage controlling element 320 and the display driver integrated circuit 122.

According to an embodiment, the conductive via 313 may be formed between the power regulator 141 and the overvoltage controlling element 320. For example, a point where a signal applied from the power regulator 141 is branched to the overvoltage controlling element 320 and the display driver integrated circuit 122 may be located between the conductive via 313 and the display driver integrated circuit 122. Thus, a circuit including the overvoltage controlling element 320, for example, an overvoltage controlling circuit may be improved.

For example, it may be assumed that the conductive via 313 is formed between the overvoltage controlling element 320 and the display driver integrated circuit 122. In this example, a portion of the second portion 312, for example, a portion arranged between the overvoltage controlling element 320 and the point at which the conductive via 313 is formed may serve as a direct impedance to the overvoltage controlling element 320. The degree of controlling an overvoltage in the overvoltage controlling circuit may be limited due to the impedance. This will be described in greater detail below with reference to FIG. 7.

In another example, it may be assumed that the conductive via 313 is formed at a position where the overvoltage controlling element 320 is arranged, for example, at a position where one end of the overvoltage controlling element 320 is arranged. In this case, the dynamic resistance of the overvoltage controlling element 320, for example, the internal resistance of the overvoltage controlling element 320 when the overvoltage controlling element 320 is conducted may increase due to the conductive via 313. When the dynamic resistance is increased, the conduction voltage (or clamping voltage) of the overvoltage controlling element 320 may be increased and a higher voltage may be transferred to the display driver integrated circuit 122.

In an embodiment, when the conductive via 313 is formed as shown in FIG. 3B, the conductive via 313 may not affect the direct impedance or internal resistance of the overvoltage controlling element 320, and the overvoltage controlling circuit may be optimized and/or improved. Thus, the printed circuit board including the overvoltage controlling circuit may transmit a stable amount of power to the display driver integrated circuit 122 even when a higher power is applied from the power regulator 141.

Figure 4A:
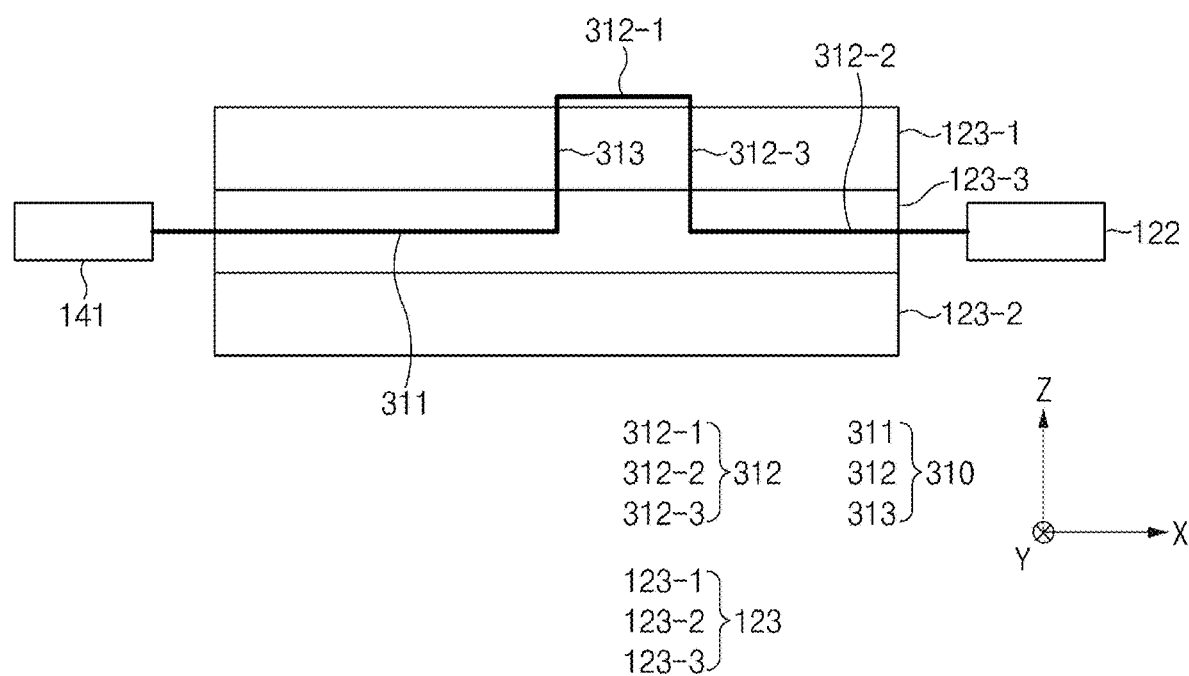
FIG. 4A is a side view illustrating an example printed circuit board on which an overvoltage controlling element is mounted, according to another embodiment.
Figure 4B:
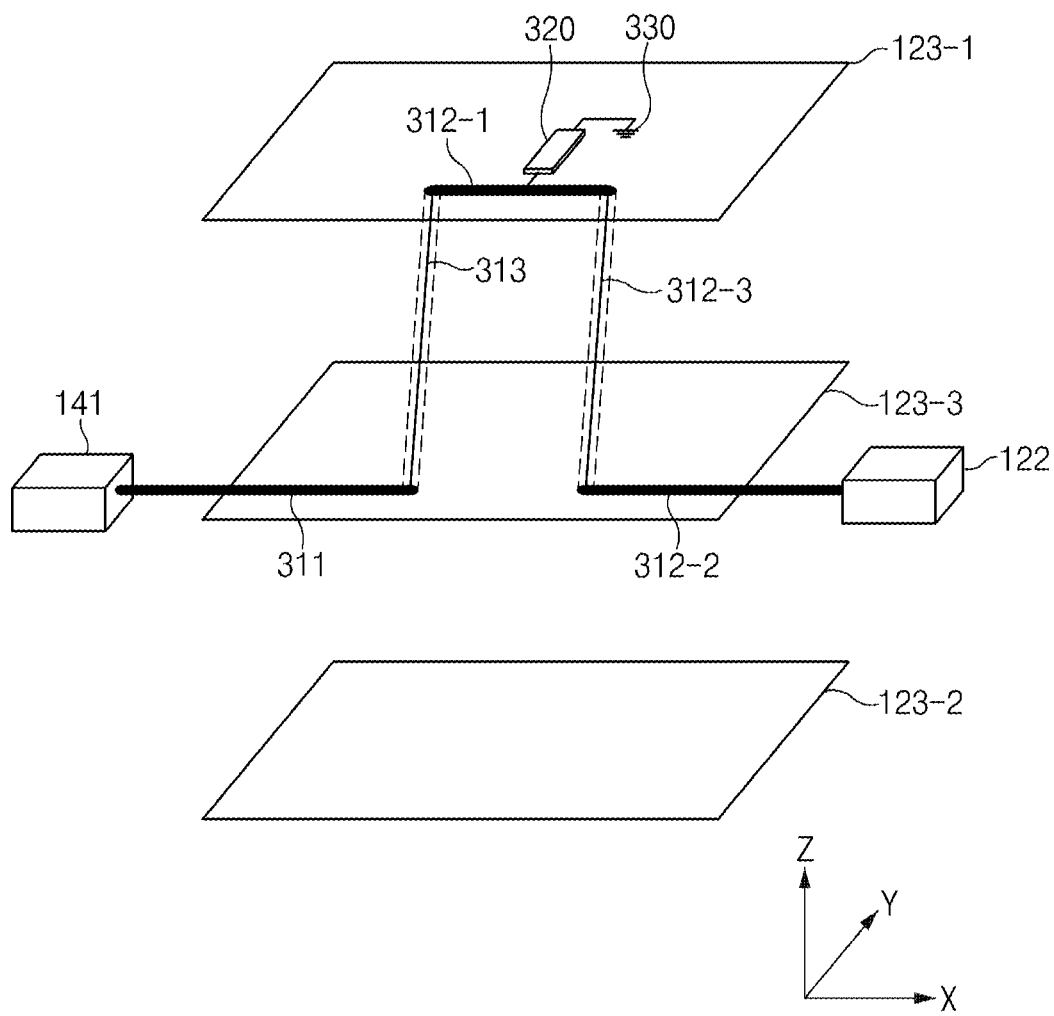
FIG. 4B is an exploded perspective view of an example printed circuit board on which an overvoltage controlling element is mounted, according to another embodiment.

FIG. 4A is a side view of an example printed circuit board on which an overvoltage controlling element is mounted, according to another embodiment. FIG. 4B is an exploded perspective view of an example printed circuit board on which an overvoltage controlling element is mounted, according to another embodiment.

Referring to FIG. 4A, the printed circuit board 123 includes a plurality of layers, for example, the first outer layer 123-1, the second outer layer 123-2, and at least one inner layer 123-3. In the description of FIG. 4A, the description overlapping with the description of FIG. 3A may not be repeated.

According to an embodiment, the printed circuit board 123 may include the conductive area 310. For example, the conductive area 310 may include the first portion 311, the second portion 312, and the conductive via 313 that electrically connects the first and second portions 311 and 312. According to an embodiment, the second portion 312 may include a third portion 312-1 arranged in the first outer layer 123-1, a fourth portion 312-2 arranged in the at least one inner layer 123-3, and a conductive via 312-3 electrically connecting the third and fourth portions 312-1 and 312-2, which is called the second conductive via 312-3.

According to an embodiment, the fourth portion 312-2 may be electrically connected to the display driver integrated circuit 122. Because the fourth portion 312-2 is arranged in the at least one inner layer 123-3 surrounded by an outer layer (e.g., the first and second outer layers 123-1 and 123-2), the power transmitted to the display driver integrated circuit 122 may be protected from electromagnetic noise generated from an outside of the printed circuit board 123.

According to an embodiment, the at least one inner layer 123-3, in which the fourth portion 312-2 is arranged, may protrude or extend from the printed circuit board 123 toward the display driver integrated circuit 122. Thus, the printed circuit board 123 may be more easily coupled to a display panel (the display panel 121 in FIG. 2) and the power applied from the power regulator 141 may be more stably transmitted to the display driver integrated circuit 122. In the disclosure, the descriptions of FIG. 4A may be equally applied to components having the same reference numerals as those of the printed circuit board 123 shown in FIG. 4A.

Referring to FIG. 4B, the overvoltage controlling element 320 may be mounted on the first outer layer 123-1. According to an embodiment, the second portion 312 may include the third portion 312-1 arranged in the first outer layer 123-1, the fourth portion 312-2 arranged in the at least one inner layer 123-3, and the second conductive via 312-3 that electrically connects the third and fourth portions 312-1 and 312-2. In the description of FIG. 4B, the description overlapping with the description of FIG. 3B may not be repeated. For example, in FIG. 4B, the description of FIG. 3B related to the overvoltage controlling element 320 may be equally or similarly applied to the description of FIG. 4B.

According to an embodiment, the second conductive via 312-3 may be formed between the overvoltage controlling element 320 and the display driver integrated circuit 122. For example, a point where a signal applied from the power regulator 141 is branched to the overvoltage controlling element 320 and the display driver integrated circuit 122 may be located between the conductive via 313 and the display driver integrated circuit 122. Thus, a circuit including the overvoltage controlling element 320, for example, an overvoltage controlling circuit may be optimized and/or improved.

For example, it may be assumed that the second conductive via 312-3 is formed between the power regulator 141 and the display driver integrated circuit 122. In this example, a part of the third portion 312-1, for example, a part arranged between the point where the conductive via is formed and the overvoltage controlling element 320 may act as a direct impedance to the overvoltage controlling element 320. The degree of controlling an overvoltage in the overvoltage controlling circuit may be limited due to the impedance. This will be described in greater detail below with reference to FIG. 7.

As another embodiment, it may be assumed that the second conductive via 312-3 may be arranged at a position where the overvoltage controlling element 320, for example, one end of the overvoltage controlling element 320 is arranged. In this case, the dynamic resistance of the overvoltage controlling element 320, for example, the internal resistance of the overvoltage controlling element 320 when the overvoltage controlling element 320 is conducted may increase due to the second conductive via. When the dynamic resistance is increased, the conduction voltage (or clamping voltage) of the overvoltage controlling element 320 may be increased and a higher voltage may be transmitted to the display driver integrated circuit 122.

In an embodiment, when the second conductive via 312-3 is formed as shown in FIG. 4B, the second conductive via 312-3 may not affect the direct impedance or internal resistance of the overvoltage controlling element 320, and the overvoltage controlling circuit may be optimized and/or improved. Thus, the printed circuit board 123 including the overvoltage controlling circuit may transmit a stable amount of power to the display driver integrated circuit 122 even when a higher power is supplied from the power regulator 141.

Figure 5A:
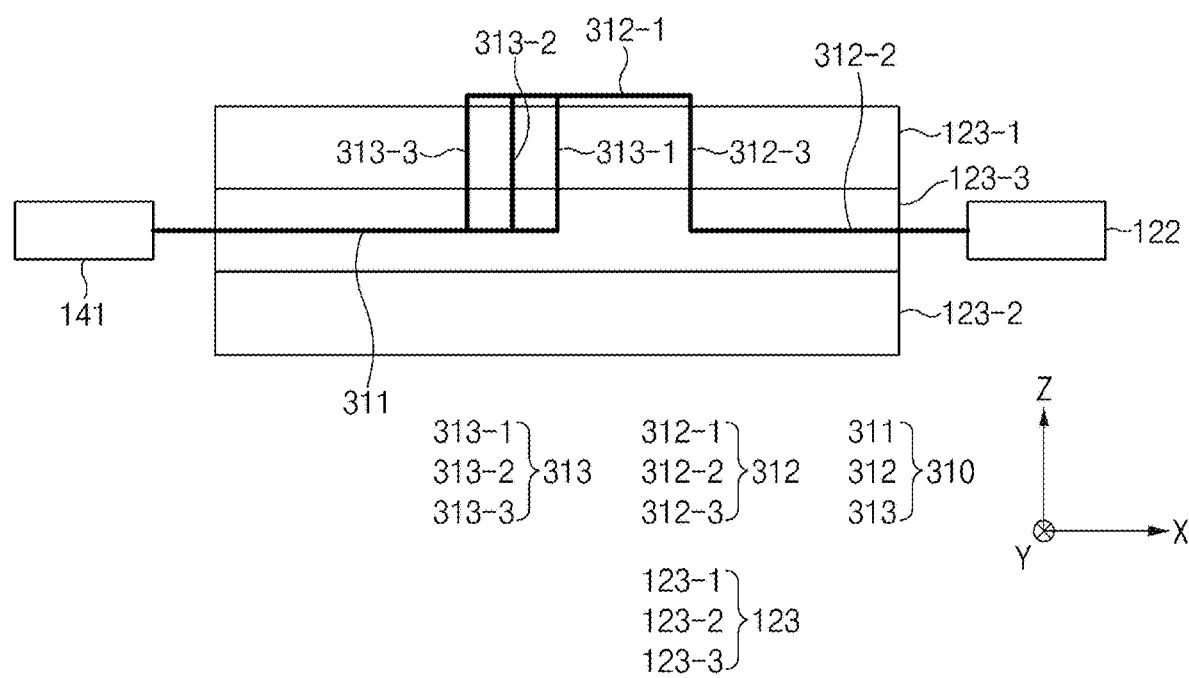
FIG. 5A is a side view illustrating an example printed circuit board on which an overvoltage controlling element is mounted, according to still another embodiment.
Figure 5B:
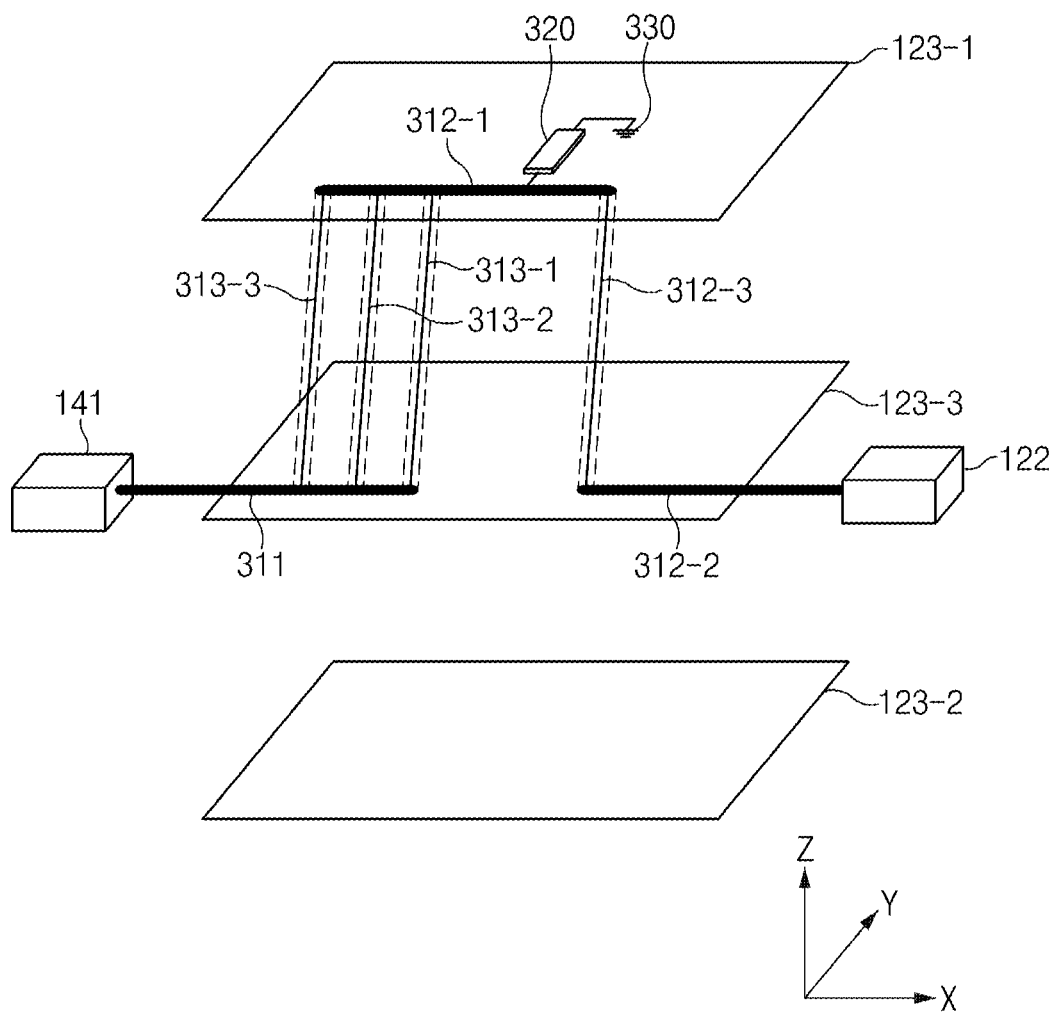
FIG. 5B is an exploded perspective view of an example printed circuit board on which an overvoltage controlling element is mounted, according to still another embodiment.

FIG. 5A is a side view of an example printed circuit board on which an overvoltage controlling element is mounted, according to still another embodiment. FIG. 5B is an exploded perspective view of an example printed circuit board on which an overvoltage controlling element is mounted, according to still another embodiment.

Referring to FIGS. 5A and 5B, the printed circuit board 123 includes a plurality of layers, for example, the first outer layer 123-1, the second outer layer 123-2, and the at least one inner layer 123-3. In the description of FIGS. 5A and 5B, the description overlapping with the description of FIGS. 3A to 4B may not be repeated.

According to an embodiment, the printed circuit board 123 may include the conductive area 310. For example, the conductive area 310 may include the first portion 311, the second portion 312, and the conductive via 313 that electrically connects the first and second portions 311 and 312. According to an embodiment, the second portion 312 may include the third portion 312-1 arranged in the first outer layer 123-1, the fourth portion 312-2 arranged in the at least one inner layer 123-3, and the second conductive via 312-3 electrically connecting the third and fourth portions 312-1 and 312-2.

According to an embodiment, a plurality of the first conductive vias 313 may be formed. For example, the first conductive via 313 may include a (1-1)th conductive via 313-1, a (1-2)th conductive via 313-2, and a (1-3)th conductive via 313-3. According to various embodiments, the number of first conductive vias 313 is not limited to that shown in FIG. 5A.

According to an embodiment, when the plurality of first conductive vias 313 are formed, the transfer efficiency of power applied from the power regulator 141 may be increased. For example, it may be understood that the plurality of first conductive vias 313 connect the first portion 311 and the third portion 312-1 in parallel. In this example, the impedance between the first and third portion 311 and 312-1 may be reduced compared to when they are connected to each other by a single first conductive via (e.g., the (1-1)th conductive via 313-1). Therefore, the power applied from the power regulator 141 may be more efficiently transmitted from the first portion 311 to the third portion 312-1.

According to an embodiment, a plurality of second conductive vias 312-3 may be formed. In this case, as in the case of the first conductive via 313, power may be more efficiently transferred from the third portion 312-1 to the fourth portion 312-2.

Figure 6A:
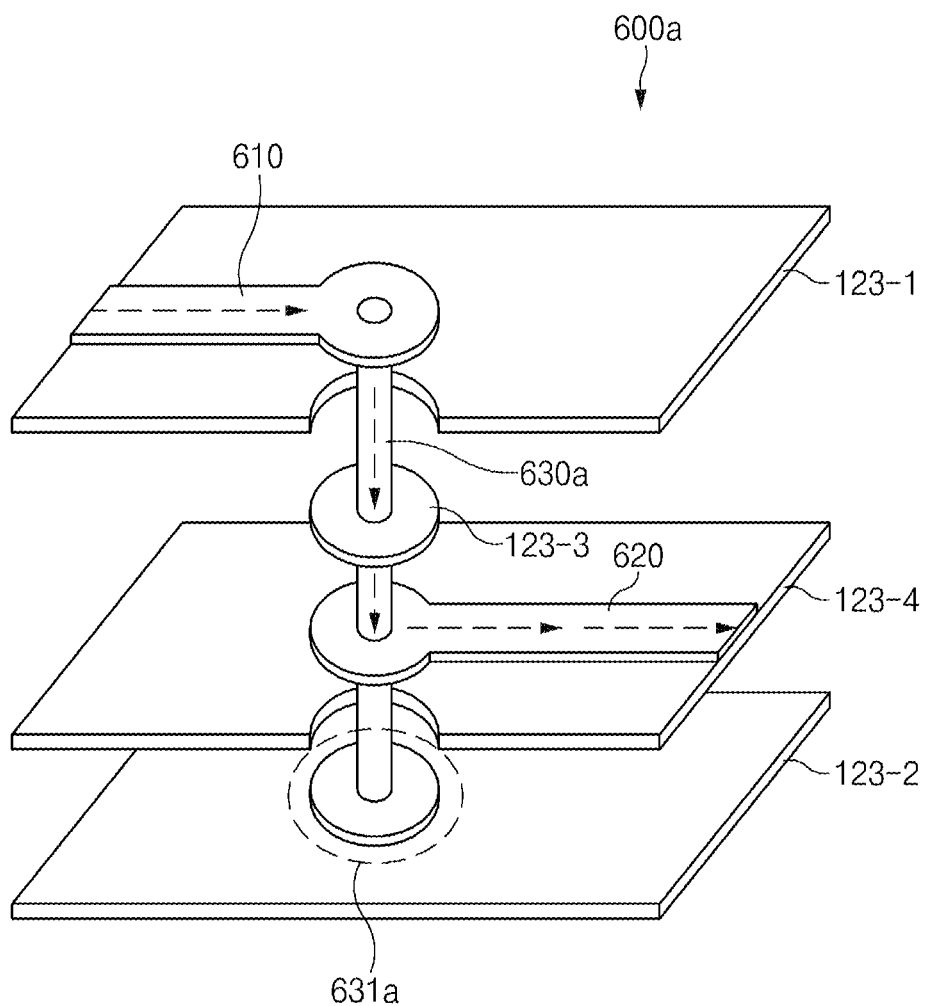
FIG. 6A is an exploded perspective view illustrating an example printed circuit board on which a conductive via is formed, according to an embodiment.
Figure 6B:
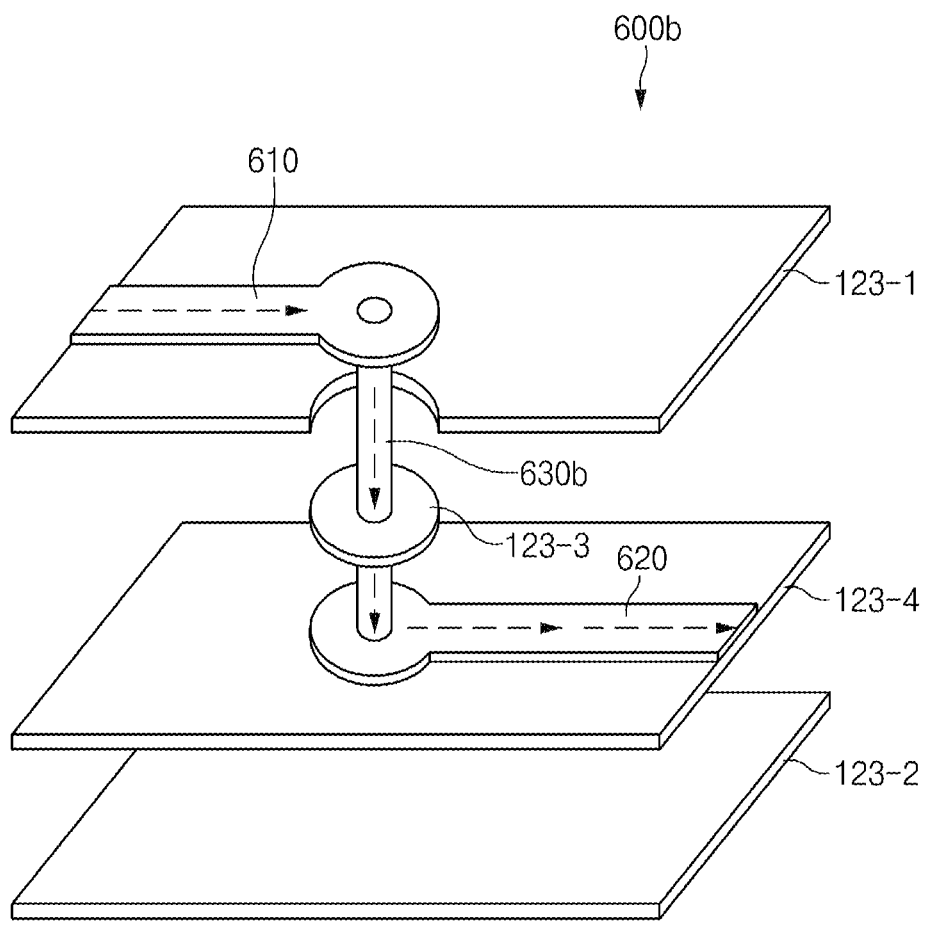
FIG. 6B is an exploded perspective view illustrating an example printed circuit board on which a conductive via is formed, according to another embodiment.

FIG. 6A is an exploded perspective view illustrating an example printed circuit board on which a conductive via is formed, according to an embodiment. FIG. 6B is an exploded perspective view illustrating an example printed circuit board on which a conductive via is formed, according to another embodiment.

Referring to FIG. 6A, a printed circuit board 600*a* may include a plurality of layers. For example, the printed circuit board 600*a* may include the first outer layer 123-1, the second outer layer 123-2, a first inner layer 123-3, and a second inner layer 123-4. The printed circuit board 600*a* may include conductive areas 610, 620 and 630*a* for transmitting a specified amount of power. For example, the conductive areas 610, 620 and 630*a* may include the first portion 610 arranged in the first outer layer 123-1, the second portion 620 arranged in the second inner layer 123-4, and the conductive via 630*a* for electrically connecting the first and second portions 610 and 620 to each other. According to various embodiments, the shapes of the printed circuit board 600*a* and the conductive areas 610, 620 and 630*a* arranged on the printed circuit board 600*a* are not limited to those in FIG. 6A. For example, the description of FIG. 6A may be applied equally or similarly to the printed circuit board 123 on which the conductive vias 313 or 312-3 shown in FIGS. 3A to 5A are formed.

According to an embodiment, the conductive via 630*a* may be formed from the first outer layer 123-1 to the second outer layer 123-2. For example, the conductive via 630*a* may be formed on not only the first outer layer 123-1, the first inner layer 123-3, and the second inner layer 123-4 in order to electrically connect the first and second portion 610 and 620 to each other but also the second outer layer 123-2. In this case, the conductive via 630*a* may include a protrusion 631*a* formed from the second inner layer 123-4 toward the second outer layer 123-2. When the conductive via 630*a* is formed to include the protrusion 631*a*, the process of the printed circuit board 600*a* may be simplified somewhat. For example, the printed circuit board 600*a* may be manufactured more easily because a via is formed through the entire layer after each layer is stacked.

Referring to FIG. 6B, a printed circuit board 600*b* may include a plurality of layers. For example, the printed circuit board 600*b* may include the first outer layer 123-1, the second outer layer 123-2, the first inner layer 123-3, and the second inner layer 123-4. The printed circuit board 600*b* may include conductive areas 610, 620 and 630*b* for transmitting a specified amount of power. For example, the conductive areas 610, 620 and 630*b* may include the first portion 610 arranged in the first outer layer 123-1, the second portion 620 arranged in the second inner layer 123-4, and the conductive via 630*b* for electrically connecting the first and second portions 610 and 620 to each other. In the description of FIG. 6B, the description overlapping with the description of FIG. 6A may not be repeated.

According to an embodiment, as shown in FIG. 6B, the conductive via 630*b* may be formed not to include the protrusion 631*a* shown in FIG. 6A. For example, the conductive via 630*b* may be formed only from the first outer layer 123-1 where the first portion 610 is arranged, to the second inner layer 123-4 where the second portion 620 is arranged. In this example, because the via is formed to penetrate only a part thereof, not the whole, the process of the printed circuit board 600*b* may be somewhat more complicated than the printed circuit board 600*a* shown in FIG. 6A. However, in this case, a signal transmitted through the conductive areas 610, 620, and 630*b* may be protected from noise that may enter from the outside of the printed circuit board 600*b*, for example, from other electronic devices. For example, the second portion 620 may be shielded from noise that may be introduced from an outside by the second outer layer 123-2 where the protrusion (e.g., the protrusion 631*a* of FIG. 6A) is not formed.

Figure 7:
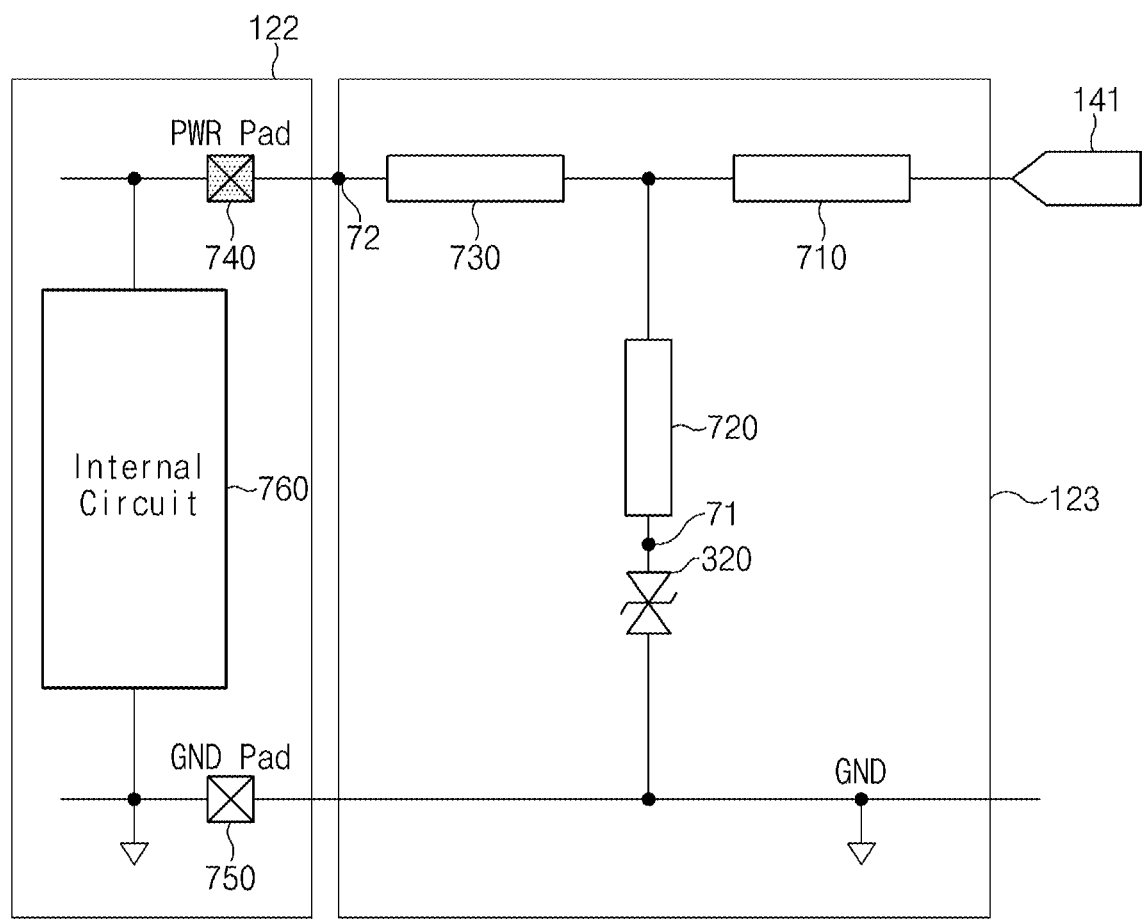
FIG. 7 is a diagram illustrating an equivalent circuit of an example overvoltage controlling circuit according to an embodiment.

FIG. 7 is a diagram illustrating an equivalent circuit of an example overvoltage controlling circuit according to an embodiment.

Referring to FIG. 7, the power applied from the power regulator 141 may be transmitted to the display driver integrated circuit 122 through an overvoltage controlling circuit included in the printed circuit board 123.

According to an embodiment, the display driver integrated circuit 122 may include a power terminal 740, a ground terminal 750, and an internal circuit 760. In an embodiment, the power terminal 740 may be electrically connected to an output terminal of the overvoltage controlling circuit and the ground terminal 750 may be electrically connected to the ground of the printed circuit board 123. According to an embodiment, the internal circuit 760 may operate based on the voltage between the power terminal 740 and the ground terminal 750.

According to an embodiment, the overvoltage controlling circuit may include a first impedance 710, a second impedance 720, a third impedance 730, and the overvoltage controlling element 320. In an embodiment, for example, it may be understood that the first impedance 710 corresponds to the first portion 311, the first conductive via 313, and at least a portion of the third portion 312-1 shown in FIG. 4B. For example, it may be understood that the second impedance 720 is an impedance between the overvoltage controlling element 320 and a point at which a portion of the third portion 312-1 is connected to the overvoltage controlling element 320 as shown in FIG. 4B. For example, it may be understood that the third impedance 730 corresponds to the remaining portion of the third portion 312-1, the second conductive via 312-3, and the fourth portion 312-2 shown in FIG. 4B. According to an embodiment, the first impedance 710 may be expressed as $R1-jwC1$, the second impedance 720 may be expressed as $R2-jwC2$, and the third impedance 730 may be expressed as $R3-jwC3$.

According to an embodiment, the response time for which the voltage of a first node 71 reaches the conduction voltage of the overvoltage controlling element 320 may be determined by a time constant determined by the first and second impedances 710 and 720, for example, $(R1+R2)\times(C1+C2)$. According to an embodiment, the response time for which the voltage of a second node 72 reaches the rated voltage of the display driver integrated circuit 122 may be determined by a time constant determined by the first impedance 710 and the third impedance 730, for example, (R1+R3)×(C1+C3). According to various embodiments, because the overvoltage controlling element 320 must be conductive before the voltage of the second node 72 reaches the rated voltage, it may be more advantageous that the response time of the first node 71 is shorter than the response time of the second node 72. Thus, for example, it may be advantageous to design the second impedance 720, for example, the impedance between the overvoltage controlling element 320 and the second portion to be minimized and/or reduced.

According to an embodiment, when the first conductive via 313 is formed between the overvoltage controlling element 320 and the display driver integrated circuit 122 in FIG. 3B, a part of the second portion 312, which is arranged, for example, between the overvoltage controlling element 320 and a point where the first conductive via is formed, may operate as the second impedance 720. Therefore, as shown in FIG. 3B, it may be advantageous that the first conductive via 313 is formed between the power regulator 141 and the overvoltage controlling element 320.

According to one embodiment, when the second conductive via 312-3 is formed between the power regulator 141 and the display driver integrated circuit 122 in FIG. 4B, a part of the third portion 312-1, for example, a part arranged between the point where the second conductive via is formed and the overvoltage controlling element 320, may operate as the second impedance 720. Accordingly, as shown in FIG. 4B, it may be advantageous that the second conductive via 312-3 is formed between the overvoltage controlling element 320 and the display driver integrated circuit 122.

Figure 8:
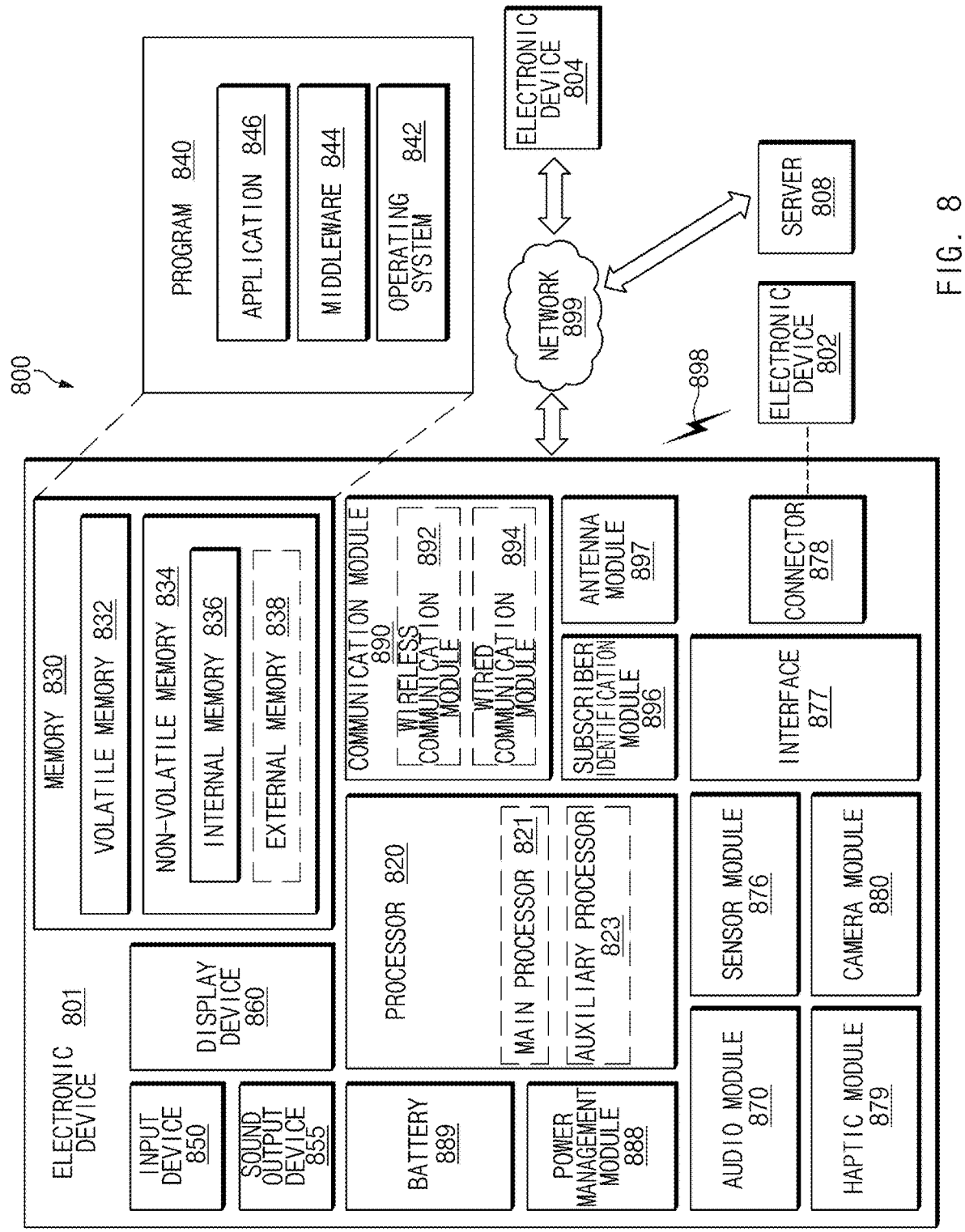
FIG. 8 is a block diagram illustrating an electronic device in a network environment according to various embodiments.

FIG. 8 is a block diagram illustrating an electronic device 801 in a network environment 800 according to various embodiments. Referring to FIG. 8, the electronic device 801 in the network environment 800 may communicate with an electronic device 802 via a first network 898 (e.g., a short-range wireless communication network), or an electronic device 804 or a server 808 via a second network 899 (e.g., a long-range wireless communication network). According to an embodiment, the electronic device 801 may communicate with the electronic device 804 via the server 808. According to an embodiment, the electronic device 801 may include a processor 820, memory 830, an input device 850, a sound output device 855, a display device 860, an audio module 870, a sensor module 876, an interface 877, a haptic module 879, a camera module 880, a power management module 888, a battery 889, a communication module 890, a subscriber identification module (SIM) 896, or an antenna module 897. In some embodiments, at least one (e.g., the display device 860 or the camera module 880) of the components may be omitted from the electronic device 801, or one or more other components may be added in the electronic device 801. In some embodiments, some of the components may be implemented as single integrated circuitry. For example, the sensor module 876 (e.g., a fingerprint sensor, an iris sensor, or an illuminance sensor) may be implemented as embedded in the display device 860 (e.g., a display).

The processor 820 may execute, for example, software (e.g., a program 840) to control at least one other component (e.g., a hardware or software component) of the electronic device 801 coupled with the processor 820, and may perform various data processing or computation. According to one embodiment, as at least part of the data processing or computation, the processor 820 may load a command or data received from another component (e.g., the sensor module 876 or the communication module 890) in volatile memory 832, process the command or the data stored in the volatile memory 832, and store resulting data in non-volatile memory 834. According to an embodiment, the processor 820 may include a main processor 821 (e.g., a central processing unit (CPU) or an application processor (AP)), and an auxiliary processor 823 (e.g., a graphics processing unit (GPU), an image signal processor (ISP), a sensor hub processor, or a communication processor (CP)) that is operable independently from, or in conjunction with, the main processor 821. Additionally or alternatively, the auxiliary processor 823 may be adapted to consume less power than the main processor 821, or to be specific to a specified function. The auxiliary processor 823 may be implemented as separate from, or as part of the main processor 821.

The auxiliary processor 823 may control at least some of functions or states related to at least one component (e.g., the display device 860, the sensor module 876, or the communication module 890) among the components of the electronic device 801, instead of the main processor 821 while the main processor 821 is in an inactive (e.g., sleep) state, or together with the main processor 821 while the main processor 821 is in an active state (e.g., executing an application). According to an embodiment, the auxiliary processor 823 (e.g., an image signal processor or a communication processor) may be implemented as part of another component (e.g., the camera module 880 or the communication module 890) functionally related to the auxiliary processor 823.

The memory 830 may store various data used by at least one component (e.g., the processor 820 or the sensor module 876) of the electronic device 801. The various data may include, for example, software (e.g., the program 840) and input data or output data for a command related thereto. The memory 830 may include the volatile memory 832 or the non-volatile memory 834.

The program 840 may be stored in the memory 830 as software, and may include, for example, an operating system (OS) 842, middleware 844, or an application 846.

The input device 850 may receive a command or data to be used by other component (e.g., the processor 820) of the electronic device 801, from the outside (e.g., a user) of the electronic device 801. The input device 850 may include, for example, a microphone, a mouse, a keyboard, or a digital pen (e.g., a stylus pen).

The sound output device 855 may output sound signals to the outside of the electronic device 801. The sound output device 855 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 860 may visually provide information to the outside (e.g., a user) of the electronic device 801. The display device 860 may include, for example, a display, a hologram device, or a projector and control circuitry to control a corresponding one of the display, hologram device, and projector. According to an embodiment, the display device 860 may include touch circuitry adapted to detect a touch, or sensor circuitry (e.g., a pressure sensor) adapted to measure the intensity of force incurred by the touch.

The audio module 870 may convert a sound into an electrical signal and vice versa. According to an embodiment, the audio module 870 may obtain the sound via the input device 850, or output the sound via the sound output device 855 or a headphone of an external electronic device (e.g., an electronic device 802) directly (e.g., wiredly) or wirelessly coupled with the electronic device 801.

The sensor module 876 may detect an operational state (e.g., power or temperature) of the electronic device 801 or an environmental state (e.g., a state of a user) external to the electronic device 801, and then generate an electrical signal or data value corresponding to the detected state. According to an embodiment, the sensor module 876 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 877 may support one or more specified protocols to be used for the electronic device 801 to be coupled with the external electronic device (e.g., the electronic device 802) directly (e.g., wiredly) or wirelessly. According to an embodiment, the interface 877 may include, for example, a high definition multimedia interface (HDMI), a universal serial bus (USB) interface, a secure digital (SD) card interface, or an audio interface.

A connecting terminal 878 may include a connector via which the electronic device 801 may be physically connected with the external electronic device (e.g., the electronic device 802). According to an embodiment, the connecting terminal 878 may include, for example, a HDMI connector, a USB connector, a SD card connector, or an audio connector (e.g., a headphone connector).

The haptic module 879 may convert an electrical signal into a mechanical stimulus (e.g., a vibration or a movement) or electrical stimulus which may be recognized by a user via his tactile sensation or kinesthetic sensation. According to an embodiment, the haptic module 879 may include, for example, a motor, a piezoelectric element, or an electric stimulator.

The camera module 880 may capture a still image or moving images. According to an embodiment, the camera module 880 may include one or more lenses, image sensors, image signal processors, or flashes.

The power management module 888 may manage power supplied to the electronic device 801. According to one embodiment, the power management module 888 may be implemented as at least part of, for example, a power management integrated circuit (PMIC).

The battery 889 may supply power to at least one component of the electronic device 801. According to an embodiment, the battery 889 may include, for example, a primary cell which is not rechargeable, a secondary cell which is rechargeable, or a fuel cell.

The communication module 890 may support establishing a direct (e.g., wired) communication channel or a wireless communication channel between the electronic device 801 and the external electronic device (e.g., the electronic device 802, the electronic device 804, or the server 808) and performing communication via the established communication channel. The communication module 890 may include one or more communication processors that are operable independently from the processor 820 (e.g., the application processor (AP)) and supports a direct (e.g., wired) communication or a wireless communication. According to an embodiment, the communication module 890 may include a wireless communication module 892 (e.g., a cellular communication module, a short-range wireless communication module, or a global navigation satellite system (GNSS) communication module) or a wired communication module 894 (e.g., a local area network (LAN) communication module or a power line communication (PLC) module). A corresponding one of these communication modules may communicate with the external electronic device via the first network 898 (e.g., a short-range communication network, such as Bluetooth™ wireless-fidelity (Wi-Fi) direct, or infrared data association (IrDA)) or the second network 899 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 892 may identify and authenticate the electronic device 801 in a communication network, such as the first network 898 or the second network 899, using subscriber information (e.g., international mobile subscriber identity (IMSI)) stored in the subscriber identification module 896.

The antenna module 897 may transmit or receive a signal or power to or from the outside (e.g., the external electronic device) of the electronic device 801. According to an embodiment, the antenna module 897 may include an antenna including a radiating element composed of a conductive material or a conductive pattern formed in or on a substrate (e.g., PCB). According to an embodiment, the antenna module 897 may include a plurality of antennas. In such a case, at least one antenna appropriate for a communication scheme used in the communication network, such as the first network 898 or the second network 899, may be selected, for example, by the communication module 890 (e.g., the wireless communication module 892) from the plurality of antennas. The signal or the power may then be transmitted or received between the communication module 890 and the external electronic device via the selected at least one antenna. According to an embodiment, another component (e.g., a radio frequency integrated circuit (RFIC)) other than the radiating element may be additionally formed as part of the antenna module 897.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 801 and the external electronic device 804 via the server 808 coupled with the second network 899. Each of the electronic devices 802 and 804 may be a device of a same type as, or a different type, from the electronic device 801. According to an embodiment, all or some of operations to be executed at the electronic device 801 may be executed at one or more of the external electronic devices 802, 804, or 808. For example, if the electronic device 801 should perform a function or a service automatically, or in response to a request from a user or another device, the electronic device 801, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 801. The electronic device 801 may provide the outcome, with or without further processing of the outcome, as at least part of a reply to the request. To that end, a cloud computing, distributed computing, or client-server computing technology may be used, for example.

Figure 9:
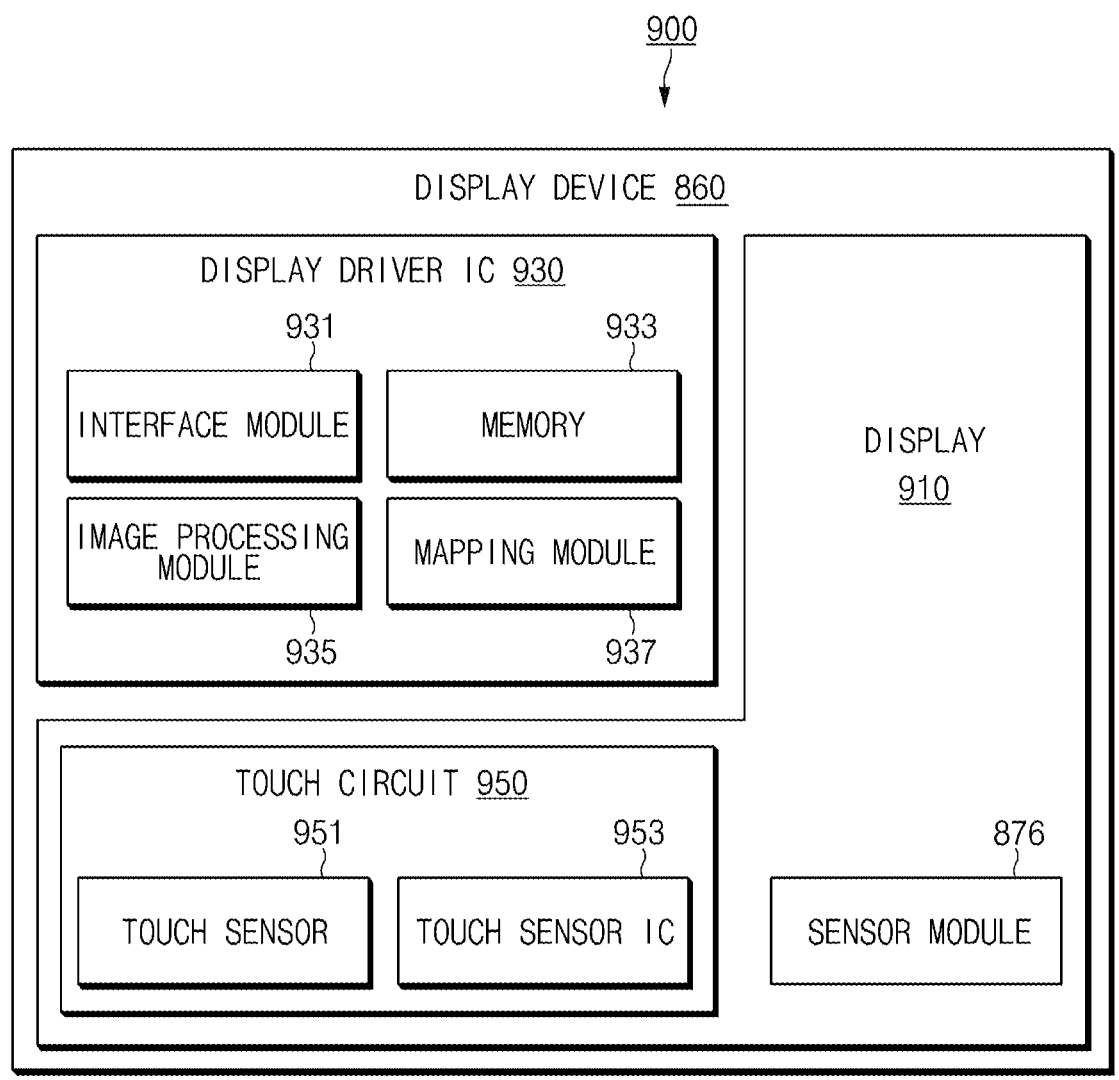
FIG. 9 is a block diagram illustrating the display device according to various embodiments.

FIG. 9 is a block diagram 900 illustrating the display device 860 according to various embodiments. Referring to FIG. 9, the display device 860 may include a display 910 and a display driver integrated circuit (DDI) 930 to control the display 910. The DDI 930 may include an interface module 931, memory 933 (e.g., buffer memory), an image processing module 935, or a mapping module 937. The DDI 930 may receive image information that contains image data or an image control signal corresponding to a command to control the image data from another component of the electronic device 801 via the interface module 931. For example, according to an embodiment, the image information may be received from the processor 820 (e.g., the main processor 821 (e.g., an application processor)) or the auxiliary processor 823 (e.g., a graphics processing unit) operated independently from the function of the main processor 821. The DDI 930 may communicate, for example, with touch circuitry 850 or the sensor module 876 via the interface module 931. The DDI 930 may also store at least part of the received image information in the memory 933, for example, on a frame by frame basis.

The image processing module 935 may perform pre-processing or post-processing (e.g., adjustment of resolution, brightness, or size) with respect to at least part of the image data. According to an embodiment, the pre-processing or post-processing may be performed, for example, based at least in part on one or more characteristics of the image data or one or more characteristics of the display 910.

The mapping module 937 may generate a voltage value or a current value corresponding to the image data pre-processed or post-processed by the image processing module 935. According to an embodiment, the generating of the voltage value or current value may be performed, for example, based at least in part on one or more attributes of the pixels (e.g., an array, such as an RGB stripe or a pentile structure, of the pixels, or the size of each subpixel). At least some pixels of the display 910 may be driven, for example, based at least in part on the voltage value or the current value such that visual information (e.g., a text, an image, or an icon) corresponding to the image data may be displayed via the display 910.

According to an embodiment, the display device 860 may further include the touch circuitry 950. The touch circuitry 950 may include a touch sensor 951 and a touch sensor IC 953 to control the touch sensor 951. The touch sensor IC 953 may control the touch sensor 951 to sense a touch input or a hovering input with respect to a certain position on the display 910. To achieve this, for example, the touch sensor 951 may detect (e.g., measure) a change in a signal (e.g., a voltage, a quantity of light, a resistance, or a quantity of one or more electric charges) corresponding to the certain position on the display 910. The touch circuitry 950 may provide input information (e.g., a position, an area, a pressure, or a time) indicative of the touch input or the hovering input detected via the touch sensor 951 to the processor 820. According to an embodiment, at least part (e.g., the touch sensor IC 953) of the touch circuitry 950 may be formed as part of the display 910 or the DDI 930, or as part of another component (e.g., the auxiliary processor 823) arranged outside the display device 860.

According to an embodiment, the display device 860 may further include at least one sensor (e.g., a fingerprint sensor, an iris sensor, a pressure sensor, or an illuminance sensor) of the sensor module 876 or a control circuit for the at least one sensor. In such a case, the at least one sensor or the control circuit for the at least one sensor may be embedded in one portion of a component (e.g., the display 910, the DDI 930, or the touch circuitry 850)) of the display device 860. For example, when the sensor module 876 embedded in the display device 860 includes a biometric sensor (e.g., a fingerprint sensor), the biometric sensor may obtain biometric information (e.g., a fingerprint image) corresponding to a touch input received via a portion of the display 910. As another example, when the sensor module 876 embedded in the display device 860 includes a pressure sensor, the pressure sensor may obtain pressure information corresponding to a touch input received via a partial or whole area of the display 910. According to an embodiment, the touch sensor 951 or the sensor module 876 may be arranged between pixels in a pixel layer of the display 910, or over or under the pixel layer.

In accordance with an example embodiment of the disclosure, a printed circuit board may include a first outer layer, a second outer layer, at least one inner layer stacked between the first and second outer layers, an overvoltage controlling element comprising overvoltage controlling circuitry mounted on the first outer layer and including a plurality of terminals of which a first terminal is connected to a ground, and a conductive area configured to transfer at least a part of a first voltage applied from an external power source to an external IC and to transfer a remaining part of the first voltage to the overvoltage controlling element, wherein the conductive area includes a first portion arranged on the at least one inner layer and electrically connected to the external power source, a second portion having at least a portion arranged on the first outer layer, the second portion electrically connecting a second terminal of the overvoltage controlling element to the external IC, and a conductive via formed between the external power source and the overvoltage controlling element to electrically connect the first portion and the second portion.

According to an embodiment, the conductive via may include at least one conductive via.

According to an embodiment, the conductive via may correspond to a first conductive via, and the second portion may include a third portion arranged on the first outer layer, a fourth portion arranged on the at least one inner layer, and a second conductive via electrically connecting the third portion and the fourth portion.

According to an embodiment, the second conductive via may be formed between the overvoltage controlling element and the external IC.

According to an embodiment, the at least one inner layer on which the fourth portion is arranged may protrude toward the external IC.

According to an embodiment, the overvoltage controlling element may include at least one of a transient voltage suppression (TVS) diode or a decoupling capacitor.

According to an embodiment, the part of the first power source may not exceed a power intensity in a maximum allowable range of the external IC.

According to an embodiment, the printed circuit board may include a flexible printed circuit board.

According to an embodiment, the at least one inner layer may have a thickness in a specified range, which is less than a thickness of the first outer layer or a thickness of the second outer layer.

According to an embodiment, the at least one inner layer may have a width in a specified range which is greater than a width of the first outer layer or a width of the second outer layer.

In accordance with another embodiment of the disclosure, an electronic device may include a housing, a display panel arranged inside the housing, a display driver integrated circuit electrically connected to the display panel and configured to control an operation of the display panel, a power regulator, and a printed circuit board coupled to a part of the display panel to electrically connect the power regulator and the display driver integrated circuit, wherein the printed circuit board includes a first outer layer on which an overvoltage controlling element comprising overvoltage controlling circuitry is mounted, a second outer layer, at least one inner layer stacked between the first and second outer layers, and a conductive area, wherein the overvoltage controlling element includes a plurality of terminals of which a first terminal is electrically connected to a ground, wherein the conductive area includes a first portion arranged on the at least one inner layer and electrically connected to the power regulator, a second portion having at least a portion arranged on the first outer layer, the second portion being electrically connected to a second terminal of the overvoltage controlling element and the display driver integrated circuit, and a conductive via formed between the power regulator and the overvoltage controlling element to electrically connect the first portion and the second portion, and wherein the power regulator is configured to apply a first voltage to one end of the conductive area, to transfer at least a part of the first voltage to the display driver integrated circuit, and to transfer a remaining part of the first voltage to the overvoltage controlling element.

According to an embodiment, the conductive via may include at least one conductive via.

According to an embodiment, the conductive via may correspond to a first conductive via, and the second portion may include a third portion arranged on the first outer layer, a fourth portion arranged on the at least one inner layer, and a second conductive via that electrically connects the third portion and the fourth portion.

According to an embodiment, the second conductive via may be formed between the overvoltage controlling element and the display driver integrated circuit.

According to an embodiment, the at least one inner layer on which the fourth portion is arranged may protrude toward the display driver integrated circuit.

According to an embodiment, the overvoltage controlling element may include at least one of a transient voltage suppression (TVS) diode or a decoupling capacitor.

According to an embodiment, the part of the first power source may not exceed a power intensity in a maximum allowable range of the external IC.

According to an embodiment, the printed circuit board may include a flexible printed circuit board.

According to an embodiment, the at least one inner layer may have a thickness in a specified range, which is less than a thickness of the first outer layer or a thickness of the second outer layer.

According to an embodiment, the at least one inner layer may have a width in a specified range which is greater than a width of the first outer layer or a width of the second outer layer.

According to the embodiments disclosed in the disclosure, a circuit including an overvoltage controlling element may be optimized and/or improved. Thus, even though a voltage exceeding a specified amplitude is applied from a power source, the power within the maximum rated power may controlled to be input to each integrated circuit The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 840) including one or more instructions that are stored in a storage medium (e.g., internal memory 836 or external memory 838) that is readable by a machine (e.g., the electronic device 801). For example, a processor (e.g., the processor 820) of the machine (e.g., the electronic device 801) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" may refer, for example to the storage medium being a tangible device, but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

While the disclosure has been illustrated and described with reference to various example embodiments thereof, it will be understood by those skilled in the art that various changes in form and details may be made therein without departing from the spirit and scope of the disclosure as defined, for example, by the appended claims and their equivalents.

What is claimed is:

1. An electronic device including a flexible printed circuit board comprising:
    a first outer circuit layer;
    a second outer circuit layer;
    an inner circuit layer stacked between the first and second outer circuit layers; and
    an overvoltage controlling element comprising overvoltage controlling circuitry mounted on the first outer circuit layer and including an input terminal and an output terminal connected to a ground;
    wherein the flexible printed circuit board connects a printed circuit board and a display panel of the electronic device,
    wherein the input terminal and the output terminal are electrically connected on the first outer circuit layer, and
    wherein a first portion of the inner circuit layer for an external power source of the printed circuit board is connected to the input terminal via at least one bridge, and a second portion of the inner circuit layer for a display IC of the display panel is connected to the output terminal via at least one bridge, and
    wherein the first portion and the second portion are only connected through the input terminal and the output terminal on the first outer circuit layer.

2. The printed circuit board of claim 1, further comprising a first conductive via formed between an external power source and the first outer circuit layer.

3. The printed circuit board of claim 2, further including a third portion arranged on the first outer circuit layer, a fourth portion arranged on the at least one inner circuit layer, and a second conductive via configured to electrically connect the third portion and the fourth portion.

4. The printed circuit board of claim 3, wherein the second conductive via is formed between an overvoltage controlling element and the display IC.

5. The printed circuit board of claim 3, wherein the at least one inner circuit layer on which the fourth portion is arranged protrudes toward the display IC.

6. The printed circuit board of claim 1, further comprising an overvoltage controlling element including at least one of a transient voltage suppression (TVS) diode or a decoupling capacitor.

7. The printed circuit board of claim 1, wherein the at least one inner circuit layer has a thickness in a specified range, which is less than a thickness of the first outer circuit layer or a thickness of the second outer circuit layer.

8. The printed circuit board of claim 1, wherein the at least one inner circuit layer has a width in a specified range which is greater than a width of the first outer circuit layer or a width of the second outer circuit layer.

least one inner layer has a width in a specified range which is greater than a width of the first outer layer or a width of the second outer layer.

* * * * *